(12) United States Patent
Disney et al.

(10) Patent No.: US 7,738,224 B2
(45) Date of Patent: Jun. 15, 2010

(54) ESD PROTECTION FOR BIPOLAR-CMOS-DMOS INTEGRATED CIRCUIT DEVICES

(75) Inventors: Donald Ray Disney, Cupertino, CA (US); Jun-Wei Chen, Saratoga, CA (US); Richard K. Williams, Cupertino, CA (US); HyungSik Ryu, San Jose, CA (US); Wai Tien Chan, Hong Kong (CN)

(73) Assignees: Advanced Analogic Technologies, Inc., Santa Clara, CA (US); Advanced Analogic Technologies (Hong Kong) Limited, Hong Kong (CN)

( * ) Notice: Subject to any disclaimer, the term of this patent is extended or adjusted under 35 U.S.C. 154(b) by 0 days.

(21) Appl. No.: 12/286,325

(22) Filed: Sep. 30, 2008

(65) Prior Publication Data

US 2009/0034136 A1 Feb. 5, 2009

Related U.S. Application Data

(62) Division of application No. 11/499,381, filed on Aug. 4, 2006.

(51) Int. Cl.
*H02H 9/00* (2006.01)

(52) U.S. Cl. ....................................................... 361/56
(58) Field of Classification Search ................... 361/56
See application file for complete search history.

(56) References Cited

U.S. PATENT DOCUMENTS

| 4,683,483 A | 7/1987 | Burnham et al. ............. 257/551 |
| 2002/0130390 A1 | 9/2002 | Ker et al. ...................... 257/546 |
| 2005/0133873 A1 | 6/2005 | Li et al. ........................ 257/362 |
| 2005/0205937 A1 | 9/2005 | Wang ........................... 257/355 |
| 2008/0029820 A1 | 2/2008 | Disney et al. ................ 257/355 |
| 2009/0032876 A1 | 2/2009 | Disney et al. ................ 257/355 |
| 2009/0034137 A1 | 2/2009 | Disney et al. .................. 361/56 |

*Primary Examiner*—Stephen W Jackson
(74) *Attorney, Agent, or Firm*—Patentability Associates

(57) ABSTRACT

An Electro-Static Discharge (ESD) protection device is formed in an isolated region of a semiconductor substrate. The ESD protection device may be in the form of a MOS or bipolar transistor or a diode. The isolation structure may include a deep implanted floor layer and one or more implanted wells that laterally surround the isolated region. The isolation structure and ESD protection devices are fabricated using a modular process that includes virtually no thermal processing. Since the ESD device is isolated, two or more ESD devices may be electrically "stacked" on one another such that the trigger voltages of the devices are added together to achieve a higher effective trigger voltage.

5 Claims, 4 Drawing Sheets

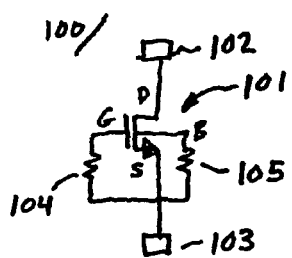
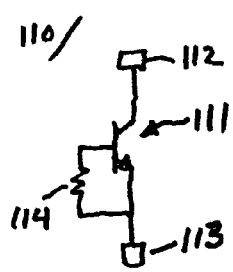
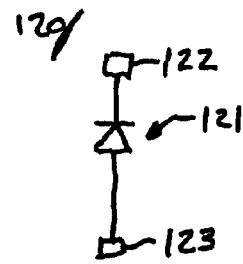
Fig. 1A
Prior Art
Fig. 1B
Prior Art
Fig. 1C
Prior Art
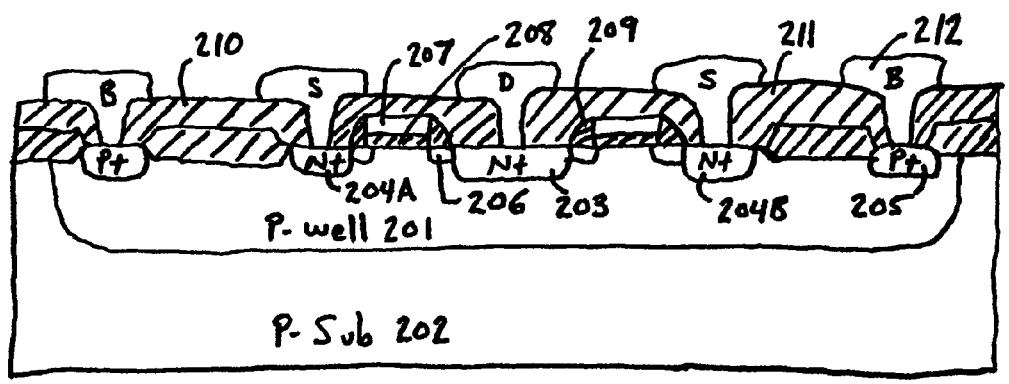
Prior Art    FIG. 2
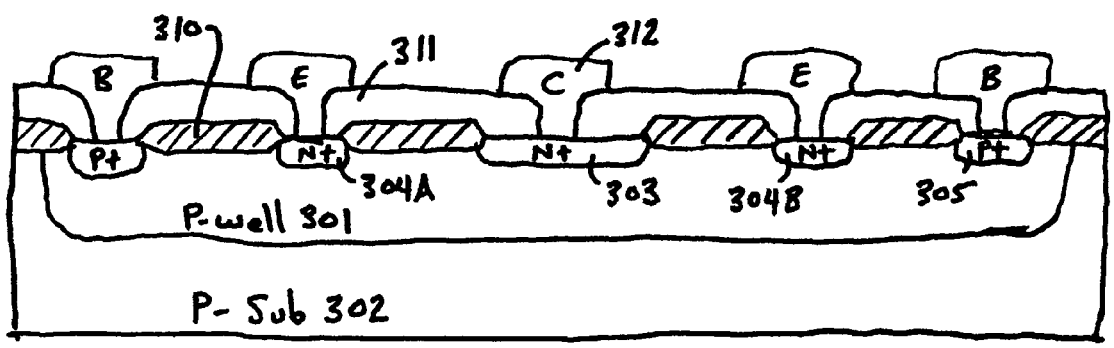
Prior Art    FIG. 3

ESD PROTECTION FOR BIPOLAR-CMOS-DMOS INTEGRATED CIRCUIT DEVICES

CROSS-REFERENCE TO RELATED APPLICATION

This application is a divisional of application Ser. No. 11/499,381, filed Aug. 4, 2006, which is incorporated herein by reference in its entirety.

FIELD OF THE INVENTION

This invention relates to semiconductor chip fabrication and in particular to methods of fabricating and electrically isolating bipolar, CMOS and DMOS transistors and passive components in a semiconductor chip monolithically at high densities without the need for high temperature fabrication processing steps, and to provide ESD protection for such devices.

BACKGROUND OF THE INVENTION

In the fabrication of integrated circuit (IC) chips, it is frequently necessary to electrically isolate devices that are formed on the surface of the chip, especially when these components operate at different voltages. Such complete electrical isolation is necessary to integrate certain types of transistors including bipolar junction transistors and various metal-oxide-semiconductor (MOS) transistors including power DMOS transistors. Complete isolation is also needed to allow CMOS control circuitry to float to potentials well above the substrate potential during operation. Moreover, complete isolation allows the design of novel Electro-Static Discharge (ESD) protection devices.

Ability to survive an ESD event is one of the key requirements for ICs. A common method for providing such ESD protection is to include one or more ESD clamp devices that are connected across the external pins of an IC. More generally, the ESD devices are connected between the input terminals of, and thus in parallel with, the circuitry that is to be protected. These clamp devices are generally designed to break down at a voltage below that which would cause damage to the internal circuitry of the IC, thus absorbing the ESD energy and protecting the IC circuitry. The most commonly used ESD clamp devices are simple diodes, NPN bipolar transistors, and grounded-gate NMOS (GGNMOS) transistors, which are designed to operate in the bipolar snapback mode.

FIGS. 1A-1C show two prior art ESD clamp devices. GGNMOS device 100 in FIG. 1A comprises a NMOS transistor 101 with drain (D) connected to input pad 102 and source (S) connected to ground pad 103. The NMOS gate (G) is connected to source through a gate resistor 104, with a value typically in the range of 1 kohm-100 kohm, and the NMOS body (B) is connected to source through internal body resistance 105 that is optimized to allow the GGNMOS to snapback due to parasitic NPN bipolar action at a reasonably low drain voltage. NPN ESD clamp device 110 in FIG. 1B comprises an NPN transistor 111 with collector (C) connected to input pad 112 and emitter (E) connected to ground pad 113. The NPN base (B) is connected to emitter through internal base resistance 114 to allow the NPN to snapback due to BVcer at a reasonably low collector voltage.

FIG. 2 shows a cross-section schematic of prior art GGNMOS device 100 from FIG. 1A. In this conventional, non-isolated CMOS process, P-well region 201, which serves as the body of the NMOS, is formed in P-type substrate 202. Therefore the body of this prior art GGNMOS is always connected to the substrate potential ("ground"). The device also includes N+ drain region 203, N+ source regions 204A and 204B, P+ contact region 205, lightly-doped drain (LDD) regions 206, gate 207, gate oxide 208, sidewall spacers 209, field oxide 210, inter-level dielectric (ILD) 211, and metal layer 212.

FIG. 3 shows a cross-section schematic of prior art NPN ESD clamp device 110 from FIG. 1B. In this conventional, non-isolated CMOS process, P-well region 301, which serves as the base of the NPN, is formed in P-type substrate 302. Therefore the body of this prior art NPN ESD clamp is always connected to the substrate potential ("ground"). The device also includes N+ collector region 303, N+ emitter regions 304A and 304B, P+ contact region 305, field oxide 310, ILD 311, and metal layer 312.

The breakdown or trigger voltage of ESD clamp devices is typically limited to less than 20V by the vertical breakdown of various junctions in a given process. ESD devices with higher trigger voltages generally rely on a lateral breakdown mechanism that is prone to current crowding, making it difficult to design large structures that effectively distribute the ESD energy. The use of series connected or "stacked" ESD clamp devices would allow the trigger voltages of a several ESD clamp devices to be added to achieve higher total trigger voltage, but this requires complete isolation of the ESD clamp devices.

Fabrication of conventional CMOS in P-type substrate material does not facilitate complete isolation of its devices since every P-type well forming the body (back-gate) of NMOS transistors is shorted to the substrate potential, typically the most negative on-chip potential. One method for achieving complete isolation is epitaxial junction-isolation, which employs an N-type epitaxial layer grown atop a P-type silicon substrate and separated into electrically isolated tubs by a deep P-type isolation diffusion—one requiring high temperature processes to implement. High temperature processing causes a redistribution of dopant atoms in the substrate and epitaxial layers, causing unwanted tradeoffs and compromises in the manufacturing of dissimilar devices fabricated using one common process. Moreover, the high-temperature diffusions and epitaxy employed in epi-JI processes are generally incompatible with the large wafer diameters and advanced low-temperature processing equipment common in submicron CMOS fabs.

What is needed is a process for integrating various IC devices with ESD protection devices that allows for the formation of stacked devices, yet eliminates the need for high temperature processing and epitaxy. Ideally, such a manufacturing process should employ "as-implanted" dopant profiles—ones where the final dopant profiles remain substantially unaltered from their original implanted profiles by any subsequent wafer processing steps. Moreover, the process should be constructed in a modular architecture where devices may be added or omitted and the corresponding process steps added or removed to the integrated flow without changing the other devices available in the process's device arsenal.

SUMMARY OF THE INVENTION

The clamping devices of this invention are formed within an isolated region of a substrate of a first conductivity type. The isolated region is bounded on the bottom by a deep implanted floor layer of a second conductivity type opposite to the first conductivity type and on the sides by one or more implanted wells of the second conductivity type that extend downward from the surface of the semiconductor material and merge with the deep implanted layer. In many embodiments the isolated region is bounded on the side by a single well that is formed in the shape of a closed figure—for example, a circle, rectangle or other polygon or some other shape.

A variety of ESD protection devices may be formed within the isolated region. For example, in one embodiment a bipolar transistor is formed in the isolated region, with its base connected to its emitter through a resistance such that a two-terminal device is formed. In another embodiment, a grounded-gate MOS device is formed with both its body region and its gate connected to its drain through respective resistances.

In yet another group of embodiments, a clamping diode is formed in the isolated region. The isolated device is formed in a P-type substrate and the floor isolation layer and the well(s) that surround the isolated region laterally are N-type. An N+ cathode region is formed at the surface of the isolated region and a P anode region is formed beneath the N+ cathode region. The P anode region may be formed by a succession of chained implants with the deeper implants having a higher doping concentration than the shallower implants. Alternatively, the anode and cathode may be formed by a series of parallel N-type and P-type regions within the isolated region.

The doped regions that constitute the isolation structure and the doped regions that constitute the ESD protection device are preferably formed by single or multiple implants with essentially no thermal processes that would result in the diffusion of the dopants. These doped regions therefore remain in an essentially "as-implanted" configuration. The process flow is modular in the sense that, with a few exceptions, the implants may be performed in virtually any order, and it is possible to eliminate one or more process steps in the fabrication of a given IC, depending on which set of devices are required.

The ESD protection devices are connected between the input terminals of the circuitry that is to be protected. Since the ESD protection devices are isolated from the substrate, they can be series connected or "stacked" such that the trigger voltages of a several ESD clamp devices are added together to achieve a higher effective trigger voltage in order to provide protection for high voltage circuits.

DESCRIPTION OF FIGURES

FIGS. 1A-1C are schematic circuit diagrams of prior art ESD protection devices.

FIG. 2 is a cross-sectional view of a prior art GGNMOS ESD clamp device.

FIG. 3 is a cross-sectional view of a prior art NPN ESD clamp device.

DESCRIPTION OF THE INVENTION

Figures 4A, 4B, 4C, 4D:
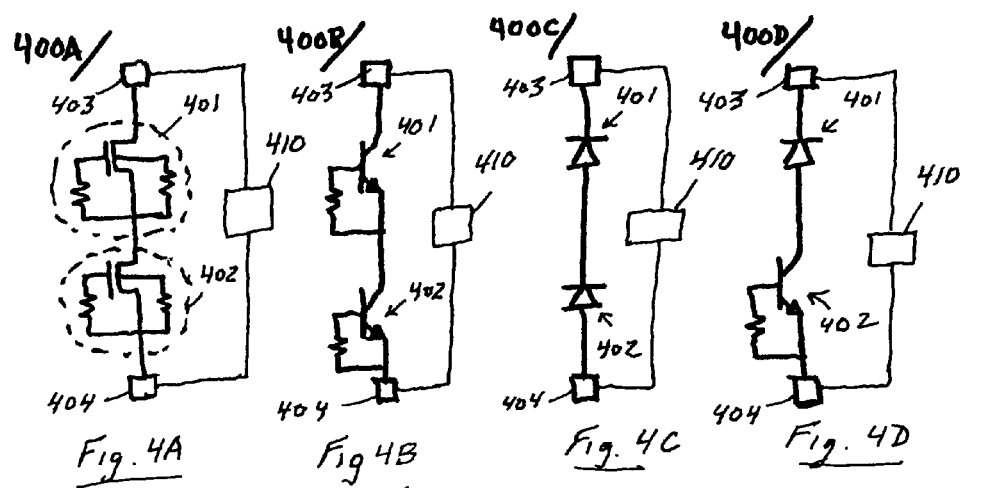
FIGS. 4A-4D are schematic circuit diagrams of stacked ESD protection devices.

An all low-temperature fabrication method using as-implanted junction isolation structures employs high-energy and chain implants with dopant implanted through contoured oxides to achieve fully-isolated bipolar, CMOS and DMOS devices without the need for isolation diffusions, epitaxy or high temperature processes. The low-temperature wafer fabrication methods and isolated device structures were previously described in pending U.S. application Ser. No. 11/298,075 and in U.S. Pat. Nos. 6,855,985, 6,900,091 and 6,943,426 to R. K. Williams et al., each of which is incorporated herein by reference.

The inventive matter in this application is related to these patents and applications but concentrates on the design and integration of isolated and stackable ESD protection structures.

The low-temperature fabrication of the high-voltage devices described in this application are compatible with the modular low-temperature fabrication methods described in the aforementioned applications, but are not necessarily limited to modular process architectures.

While specific embodiments of this invention have been described, it should be understood that these embodiments are illustrative only and not limiting. Many additional or alternative embodiments in accordance with the broad principles of this invention will be apparent to those of skill in the art.

Wafer Fabrication

Except as specifically stated, wafer fabrication of the devices described herein utilizes the same process sequence that is described in the above referenced patents. A brief summary of the basic process flow includes Field oxide formation
    High-energy implanted deep drift layer (ND) formation
    High-energy implanted floor isolation (DN) formation
    $1^{st}$ chain-implanted non-Gaussian N-well (NW1/NW1B) formation
    $1^{st}$ chain-implanted non-Gaussian P-well (PW1/PW1B) formation
    $2^{nd}$ chain-implanted non-Gaussian N-well (NW2/NW2B) formation
    $2^{nd}$ chain-implanted non-Gaussian P-well (PW2/PW2B) formation
    Dual gate oxide and gate electrode formation
    N-base implant
    P-base implant
    $1^{st}$ N-LDD implant (NLDD1)
    $1^{st}$ P-LDD implant (PLDD1)
    $2^{nd}$ N-LDD implant (NLDD2)
    $2^{nd}$ P-LDD implant (PLDD2)
    ESD implant
    Sidewall spacer formation
    N+ implant
    P+ implant
    Rapid thermal anneal (RTA) implant activation
    Multilayer metal interconnect process
    Passivation Since the process as described utilizes "as-implanted" dopant profiles with little or no dopant redistribution, implants may be performed in virtually any order except that it is preferred that the P-well and N-well implantation precede gate formation, the trench gate formation precede DMOS body implantation, N-LDD and P-LDD implants follow gate formation but precede sidewall spacer formation, and N+ and P+ implants follow sidewall spacer formation. This process flow is designed to be modular, so it is possible to eliminate one or more process steps in the fabrication of a given IC, depending on which set of devices are required for that IC design.

By way of example, the table below summarizes a preferred embodiment and a preferred range of conditions for the implants described in this application:

| Implant (Species) | Preferred Embodiment (Energy, Dose) | Preferred Range (Energy, Dose) |
|---|---|---|
| DN (P+) | E = 2.0 MeV, Q = 2E13 cm$^{-2}$ | E = 1.0 MeV to 3.0 keV, Q = 1E12 to 1E14 cm$^{-2}$ |
| ND deep drift (P+) | E = 800 keV, Q = 2E12 cm$^{-2}$ | E = 400 keV to 1.2 MeV, Q = 5E11 to 5E12 cm$^{-2}$ |
|  | E = 600 keV, Q = 2E12 cm$^{-2}$ | E = 300 keV to 900 keV, Q = 5E11 to 5E12 cm$^{-2}$ |
| P-body (B+) | E = 120 keV, Q = 2E12 cm$^{-2}$ | E = 60 keV to 180 keV, Q = 5E11 to 5E12 cm$^{-2}$ |
|  | E = 80 keV, Q = 4E12 cm$^{-2}$ | E = 40 keV to 120 keV, Q = 1E12 to 1E13 cm$^{-2}$ |
| 1st P-well + (B+) | E = 240 keV, Q = 1E13 cm$^{-2}$ | E = 120 keV to 360 keV, Q = 5E12 to 5E13 cm$^{-2}$ |
|  | E = 120 keV, Q = 6E12 cm$^{-2}$ | E = 60 keV to 180 keV, Q = 1E12 to 1E13 cm$^{-2}$ |
| 1st N-well + (P+) | E = 460 keV, Q = 5E12 cm$^{-2}$ | E = 230 keV to 690 keV, Q = 1E12 to 1E13 cm$^{-2}$ |
|  | E = 160 keV, Q = 1E12 cm$^{-2}$ | E = 80 keV to 240 keV, Q = 5E11 to 5E12 cm$^{-2}$ |
| 2nd P-well + (B+) | E = 460 keV, Q = 1E13 cm$^{-2}$ | E = 230 keV to 690 keV, Q = 5E12 to 5E13 cm$^{-2}$ |
|  | E = 160 keV, Q = 1E12 cm$^{-2}$ | E = 80 keV to 240 keV, Q = 5E11 to 5E12 cm$^{-2}$ |
| 2nd N-well + (P+) | E = 950 keV, Q = 1E13 cm$^{-2}$ | E = 500 keV to 1.5 MeV, Q = 5E12 to 5E13 cm$^{-2}$ |
|  | E = 260 keV, Q = 1E12 cm$^{-2}$ | E = 130 keV to 390 keV, Q = 5E11 to 5E12 cm$^{-2}$ |
| N-base (P+) | E = 300 keV, Q = 2E12 cm$^{-2}$ | E = 150 keV to 450 keV, Q = 5E11 to 5E12 cm$^{-2}$ |
|  | E = 120 keV, Q = 9E12 cm$^{-2}$ | E = 60 keV to 180 keV, Q = 5E12 to 5E13 cm$^{-2}$ |
| P-base (B+) | E = 240 keV, Q = 6E12 cm$^{-2}$ | E = 120 keV to 360 keV, Q = 1E12 to 1E13 cm$^{-2}$ |
|  | E = 100 keV, Q = 6E12 cm$^{-2}$ | E = 50 keV to 150 keV, Q = 1E12 to 1E13 cm$^{-2}$ |
| NLDD1 (P+) | E = 80 keV, Q = 2E13 cm$^{-2}$ | E = 40 keV to 160 keV, Q = 5E12 to 5E13 cm$^{-2}$ |
| PLDD1 (BF$_2$+) | E = 80 keV, Q = 2E12 cm$^{-2}$ | E = 40 keV to 160 keV, Q = 5E11 to 5E12 cm$^{-2}$ |
| NLDD2 (P+) | E = 80 keV, Q = 6E12 cm$^{-2}$ | E = 40 keV to 160 keV, Q = 1E12 to 1E13 cm$^{-2}$ |
| PLDD2 (BF$_2$+) | E = 100 keV, Q = 3E12 cm$^{-2}$ | E = 50 keV to 150 keV, Q = 1E12 to 1E13 cm$^{-2}$ |
| NESD (P+) | E = 40 keV, Q = 1E15 cm$^{-2}$ | E = 20 keV to 150 keV, Q = 1E14 to 5E15 cm$^{-2}$ |
| N+ (As+) | E = 30 keV, Q = 5E15 cm$^{-2}$ | E = 20 keV to 60 keV, Q = 1E15 to 1E16 cm$^{-2}$ |
| P+ (BF$_2$+) | E = 30 keV, Q = 3E15 cm$^{-2}$ | E = 20 keV to 60 keV, Q = 1E15 to 1E16 cm$^{-2}$ |

Using this process architecture, a number of unique ESD protection devices may be fabricated and integrated into an IC in a modular fashion. These new ESD devices include isolated diodes, GGNMOS, and NPN devices. An important feature of these devices is the complete isolation provided by a high-energy implanted floor isolation layer (DN). Since these devices are isolated from the substrate, they can be series connected or "stacked" such that the trigger voltages of a several ESD clamp devices are added together to achieve a higher effective trigger voltage in order to provide protection for high voltage circuits. Stacking two devices that each have a 16V trigger voltage, for example, yields a combined trigger voltage of 32V, which may be suitable for protection of 30V circuitry. Formation of such stacked devices is simply not possible using prior art non-isolated CMOS processes, and while it is theoretically possible using epitaxial junction isolation techniques, the size of the ESD clamps would be prohibitive. Thus, the ESD devices of this invention are unique in their combination of isolation and cost-effectiveness.

FIGS. 4A-4D show a circuit schematic of stacked ESD clamp structures 400A-400D, respectively, each comprising a top ESD clamp 401 and a bottom ESD clamp 402 connected in series between an input pad 403 and a ground pad 404 and in parallel with a circuit 410 that is to be protected. Bottom ESD clamp 402 may be non-isolated (having a common terminal connected to the substrate) or isolated from the substrate. It may comprise any of several possible ESD clamp devices, including a GGNMOS as shown in FIG. 4A, an NPN ESD clamp as shown in FIGS. 4B and 4D, an ESD clamp diode as shown in FIG. 4C, or other related devices. Top ESD clamp 401 is isolated from the substrate such that it can float to a high voltage and thus be stacked in series with bottom ESD clamp 402. Top ESD clamp 401 may comprise any of several possible ESD clamp devices, including a GGNMOS, as shown in FIG. 4A, an NPN ESD clamp as shown in FIG. 4B, an ESD clamp diode as shown in FIGS. 4C and 4D, or other related devices. The top and bottom ESD clamp devices may the same type, or different types of devices may be used for the top and bottom clamps, respectively. For example, an NPN ESD clamp may be used on the bottom and an isolated ESD clamp diode on the top, as shown in stacked ESD clamp structure 400D in FIG. 4D.

Figure 5:
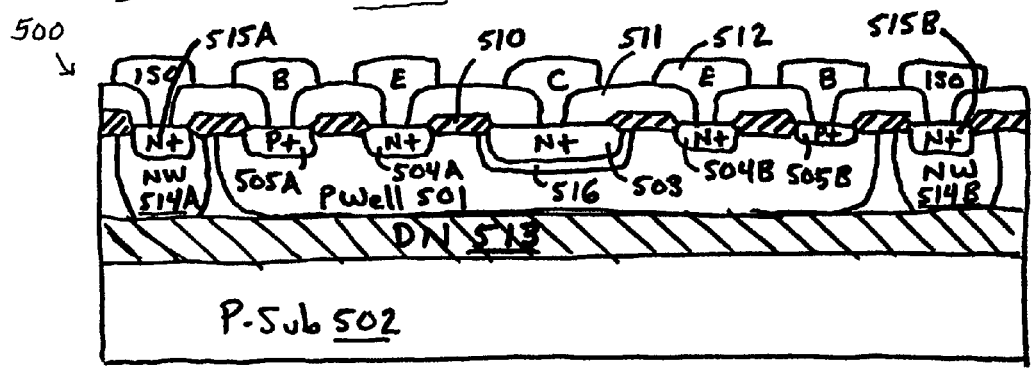
FIG. 5 is a cross-sectional view of an isolated NPN ESD clamp device.

FIG. 5 shows a cross-sectional view of an isolated NPN ESD clamp 500. An N+ collector 503 is separated from N+ emitters 504A and 504B by a significant distance, for example 10-100 um, to provide some ballasting resistance to distribute the ESD current uniformly. P+ base contacts 505A and 505B are spaced from the emitters 504A and 504B by a significant distance, for example 10-100 um, to provide some resistance between the base 501 and emitters 504A and 504B, which lowers the bipolar snapback voltage and allows easier triggering during an ESD event. An optional ESD implant 516 may be included adjacent the collector 503 to provide a lower trigger voltage (breakdown of the collector-base junction) for improved ESD protection. A trigger voltage of 16V, for example, may be used to provide protection of the 12V CMOS devices having a typical junction breakdown of 20V. The NPN ESD clamp 500 shown in FIG. 5 also includes DN floor isolation layer 513 and N-type sidewall isolation regions 514A and 514B to provide complete isolation of the ESD clamp 500 from P-type substrate 502. Active regions are separated by field oxide layer 510 and contacted by metallization layer 512 through contact holes in ILD 511. Isolation (ISO) electrodes are connected to DN layer 513 via N+ contacts 515A and 515B. Depending on the bias conditions of the input pad, the ISO electrodes may be tied to the same potential as the collector 503, the same potential as the base 501, or some other potential defined in the IC.

Clamp 500 may be an annular device, with collector 503 at the center and each of emitters 504A, 504B, P+ base contacts 505A, 505B, and isolation regions 514A, 514B in an annular shape surrounding collector 503. Note: As used herein, the term "annular" refers to a geometrical figure having an open center region whether the shape is circular, rectangular, hexagonal or some other shape.

Figure 6:
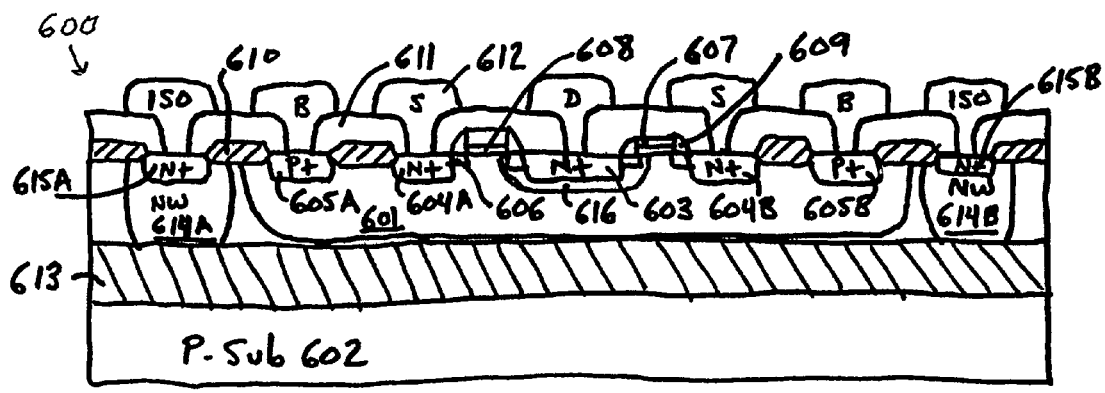
FIG. 6 is a cross-sectional view of an isolated GGNMOS ESD clamp device.

FIG. 6 shows a cross-sectional view of an isolated GGN-MOS ESD clamp 600. P-well region 601, which serves as the body of the NMOS 600, is isolated from P-type substrate 202 by DN floor isolation layer 613 and N-type sidewall isolation regions 614A and 614B. The device also includes N+ drain region 603, N+ source regions 604A and 604B, P+ body contact regions 605A and 605B, LDD regions 606, gate 607, gate oxide layer 608, sidewall spacers 609, field oxide layer 610, ILD 611, and metallization layer 612. The metallization contact to N+ drain 603 is separated from the edges of gate 607 by a significant distance, for example 1-10 microns, to provide some ballasting resistance to distribute the ESD current uniformly among multi-fingered GGNMOS clamp devices. P+ body contacts 605A and 605B are spaced from the source regions 604A and 604B by a significant distance, for example 1-10 microns, to provide some resistance between the source regions 604A and 604B and the body 601, which lowers the bipolar snapback voltage and allows easier triggering during an ESD event. An optional ESD implant 616 may be included adjacent the drain region to provide a lower trigger voltage (breakdown of the drain-body junction) for improved ESD protection. A trigger voltage of 9V, for example, may be used to provide protection of the 5V CMOS devices having a typical junction breakdown of 12V. Active regions are separated by field oxide layer 610 and contacted by metallization layer 612 through contact holes in ILD 611. Isolation (ISO) electrodes are connected to DN 613 via N+ contact regions 615A and 615B. Depending on the bias conditions of the input pad, the ISO electrodes may be tied to the same potential as the drain 603, the same potential as the body 601, or some other potential defined in the IC.

Like device 500, device 600 may be annular, with gate 607, source regions 604A, 604B, body contacts 605A, 605B, and sidewall isolation regions 614A, 614B surrounding drain region 603.

Figure 7A:
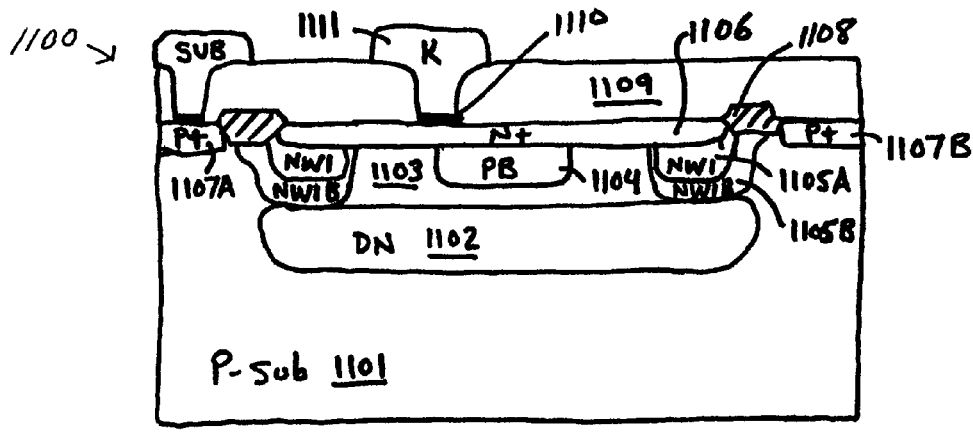
FIGS. 7A-7C are cross-sectional views of an isolated ESD clamp diodes.

FIG. 7A shows a cross-sectional view of an isolated ESD clamp diode 1100 comprising P-type region 1103 that is isolated from P-type substrate 1101 by high-energy implanted DN floor isolation layer 1102 and sidewall isolation N-wells 1105A and 1105B, which may be annular. N+ cathode 1106 extends across the semiconductor surface between LOCOS oxide regions 1108 and forms electrical contact with the floor isolation layer 1102 through its overlap onto N-wells 1105A and 1105B. The N+ cathode (K) 1106, is contacted through ILD 1109 and electrically connected by metal layer 1111 through an optional barrier metal layer 1110. P-body or P-base anode 1104 is contained within isolated P-type region 1103 and contacted by a P+ region (not shown) within the isolated P-type region 1103. The contact is preferably formed in the dimension into the page, by interrupting the N+ cathode 1106 to insert the P+ region. Contact to non-isolated P-type substrate 1101 is facilitated by P+ regions 1107A and 1107B, which in a preferred embodiment form a ring circumscribing the diode 1100.

Figure 7B:
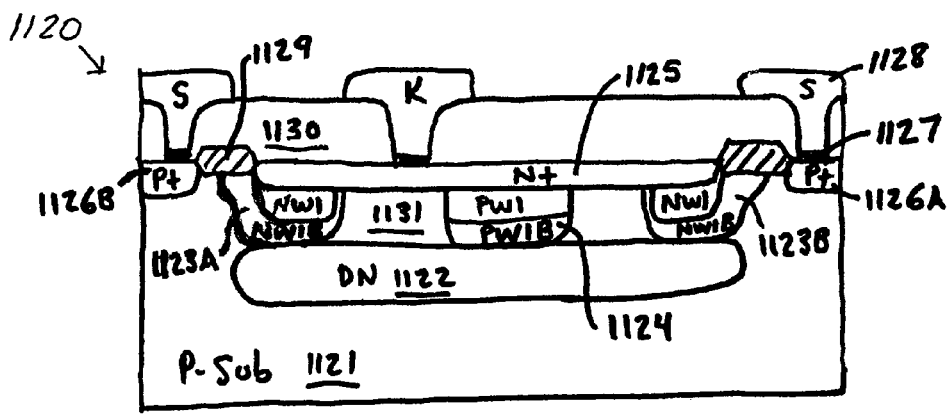

FIG. 7B shows a cross-sectional view of an isolated ESD clamp diode 1120 comprising P-type region 1131 that is isolated from P-type substrate 1121 by high-energy implanted DN floor isolation layer 1122 and sidewall isolation N-wells 1123A and 1123B, which may be annular. N+ cathode 1125 extends across the semiconductor surface between LOCOS oxide regions 1129 and forms electrical contact with the floor isolation layer 1122 through its overlap onto N-wells 1123A and 1123B. The N+ cathode (K) 1125, is contacted through ILD 1130 and electrically connected by metal layer 1128 through optional barrier metal layer 1127. P-well anode 1124 is contained within isolated P-type region 1131 and contacted by a P+ region (not shown) within the isolated P-type region 1131. The contact is preferably formed in the dimension into the page, by interrupting the N+ cathode 1125 to insert the P+ region. Contact to non-isolated P-type substrate 1121 is facilitated by P+ regions 1126A and 1126B, which in a preferred embodiment form a ring circumscribing the diode 1120.

Unlike a conventional diffused well which has its peak concentration near the surface and a monotonically decreasing concentration with increasing depth, P-well 1124 may be formed by a high energy ion implantation of boron, for example, and preferably by a boron chain-implant comprising a series of boron implants varying in dose and energy. The chain implant, while it may comprise any number of implants, is graphically represented in the drawing by two regions—a surface layer PW1, and a subsurface layer PW1B, formed by ion implantation through a single mask and without the use of epitaxy. In a preferred embodiment the deeper layer PW1B is more highly concentrated than the surface layer PW1.

Figure 7C:
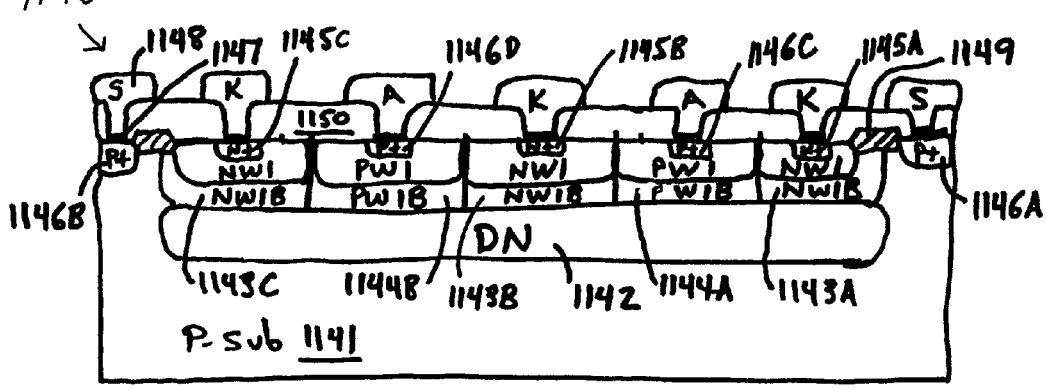

FIG. 7C shows a cross-section of an isolated ESD clamp diode 1140 comprising multiple parallel N-well to P-well junctions all contained in an isolated P-type region. Isolated P-wells 1144A and 1144B are contacted by P+ regions 1146D and 1446C, and N-wells 1143A, 1143B and 1143C are contacted by N+ regions 1145A, 1145B, and 1145C. The resulting diodes are isolated from P-type substrate 1141 by high energy implanted DN floor isolation layer 1142 and N-wells 1143A and 1143C. The device is circumscribed by LOCOS field oxide layer 1149 and P+ substrate ring 1146A and 1146B. The active areas are contacted through ILD 1150 by metal layer 1148 through optional barrier metal layer 1147.

Unlike a conventional diffused wells which have peak concentrations near the surface and a monotonically decreasing concentration with increasing depth, the P-wells 1144A and 1144B, along with N-wells 1143A, 1143B and 1143C, are formed by high energy ion implantation, and preferably by a chain-implant comprising a series of implants varying in dose and energy. While the chain implants may comprise any number of implant steps, they are graphically represented in the drawing by two regions—surface layers PW1 and NW1, and a subsurface layers PW1B and NW1B. In a preferred embodiment the deeper layers NW1B and PW1B are more highly concentrated than the surface layers NW1 and PW1, causing the breakdown of the Zener diodes to occur at a location well below the surface.

The various features shown in the isolated ESD clamp examples of FIGS. 7A-7C are illustrative of structures that are compatible with the disclosed process and capable of providing cost-effective, stacked ESD protection devices. It is well within the scope of this invention to combine the features from different figures to arrive at the best termination structure for a given implementation. For example, it is possible to add metal interconnect layers above the single metal layer shown, to substitute the LOCOS field oxide layers with alternative field dielectric schemes such as deposited and/or recessed field oxides.

Figure 8:
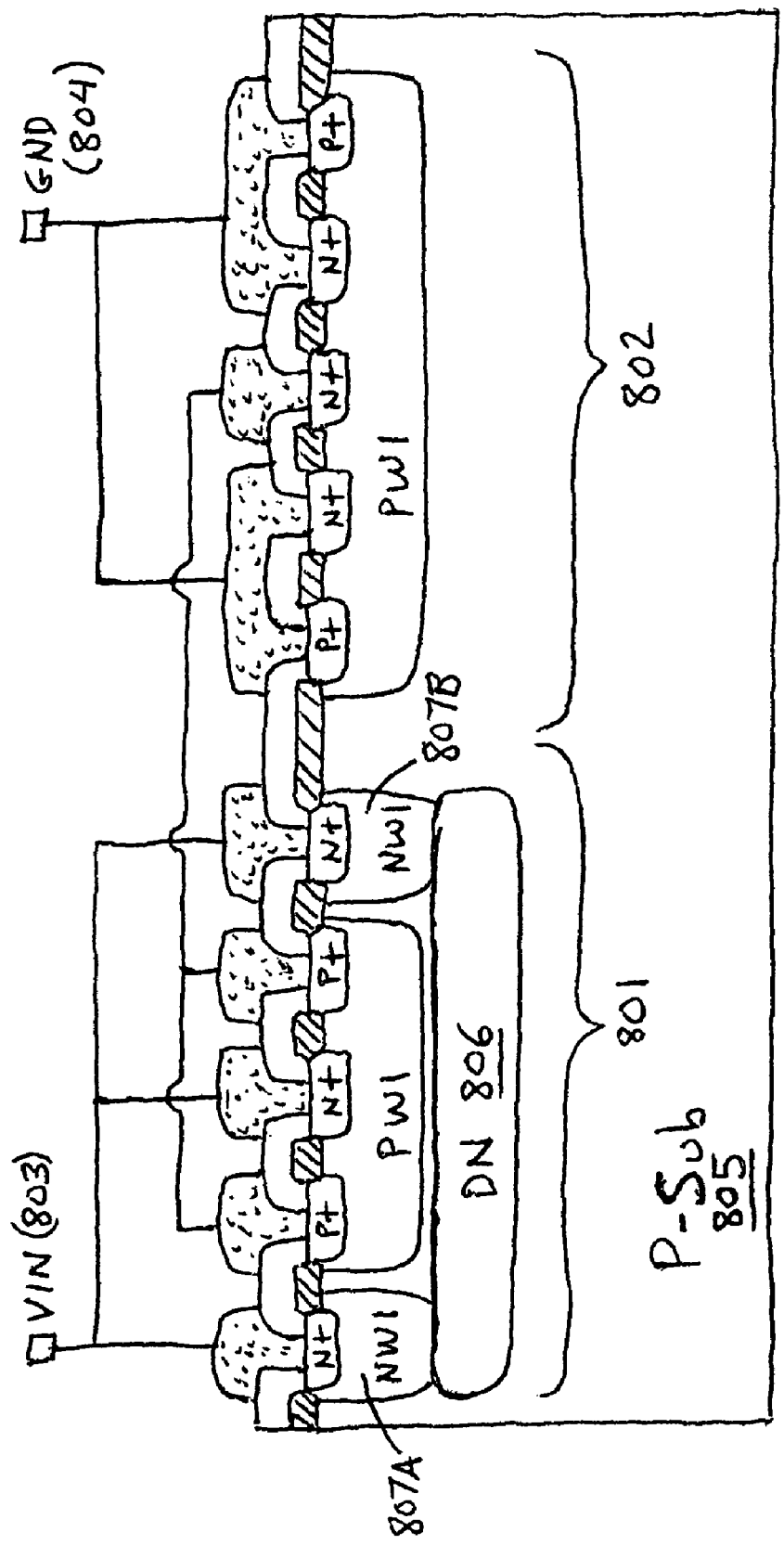
FIG. 8 is a cross-sectional view of a stacked ESD clamp structure.

FIG. 8 shows a cross-sectional view of a stacked ESD clamp structure comprising a top ESD clamp 801 and a bottom ESD clamp 802 connected in series. Electrical connections are illustrated schematically, showing the ESD clamps connected between an input pad 803 and a ground pad 804. Bottom ESD clamp 802 is non-isolated (has a common terminal connected to substrate 805), while top ESD clamp 801 is isolated from substrate 805 by DN floor isolation layer 806 and N-type sidewall isolation regions 807A and 807B.

While specific embodiments of this invention have been described, these embodiments are illustrative only and not limiting. Persons of skill in the art will readily see that numerous alternative embodiments are possible in accordance with the broad principles of this invention.

We claim:

1. An isolated ESD protection device, the device being connected between the input terminals of a circuit to be protected, both the device and the circuit being formed in a semiconductor substrate of a first conductivity type, the device comprising:
   a floor isolation layer of a second conductivity type;
   a sidewall isolation region of the second conductivity type, the sidewall isolation region extending down from a surface of the substrate and merging with the floor isolation layer to form an isolated region of the substrate; and
   an ESD clamp structure within the isolated region, wherein the ESD clamp structure comprises a bipolar transistor, the bipolar transistor comprising:
   a collector region of the second conductivity type;
   an emitter region of the second conductivity type; and
   a base region of the first conductivity type interposed between the collector region and the emitter region.

2. The isolated ESD protection device of claim 1 further comprising a base contact region of the first conductivity type, the base contact region being disposed in a portion of the base region.

3. The isolated ESD protection device of claim 1 further comprising an isolation contact region at a surface of the substrate within the sidewall isolation region, the isolation contact region being in electrical contact with an isolation contact.

4. An ESD protection device formed in a semiconductor substrate comprising:
   a first ESD clamp structure;
   at least one additional ESD clamp structure, the at least one additional ESD clamp structure being electrically isolated from the substrate, all of the ESD clamp structures being connected in series with each other between input terminals of a circuit to be protected;
   wherein each of the first ESD clamp structure and the at least one additional ESD clamp structure comprises a bipolar transistor.

5. An ESD protection device formed in a semiconductor substrate comprising:
   a first ESD clamp structure;
   at least one additional ESD clamp structure, the at least one additional ESD clamp structure being electrically isolated from the substrate, all of the ESD clamp structures being connected in series with each other between input terminals of a circuit to be protected;
   wherein the first ESD clamp structure comprises a bipolar transistor and the at least one additional ESD clamp structure comprises a diode.

* * * * *